(12) United States Patent
Fan

(10) Patent No.: US 7,811,095 B2
(45) Date of Patent: Oct. 12, 2010

(54) SOCKET HAVING ALIGNING KEYS FOR ACCOMMODATING DIFFERENT SIZES OF INTEGRATED CHIPS

(75) Inventor: Chia-Wei Fan, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 154 days.

(21) Appl. No.: 12/214,162

(22) Filed: Jun. 16, 2008

(65) Prior Publication Data

US 2008/0311770 A1    Dec. 18, 2008

(30) Foreign Application Priority Data

Jun. 15, 2007    (CN) .......................... 2007 2 0039618

(51) Int. Cl.
 *H01R 12/00* (2006.01)
(52) U.S. Cl. ........................................ 439/68; 439/681
(58) Field of Classification Search .................. 439/68, 439/70, 71, 681
 See application file for complete search history.

(56) References Cited

U.S. PATENT DOCUMENTS 6,164,980 A    12/2000 Goodwin 6,908,316 B2    6/2005 Ma et al.
7,083,456 B2    8/2006 Trout et al.
7,207,808 B2 *    4/2007 Ma .............................. 439/71

\* cited by examiner

*Primary Examiner*—Tho D Ta
*Assistant Examiner*—Travis Chambers
(74) *Attorney, Agent, or Firm*—Andrew C. Cheng; Wei Te Chung; Ming Chieh Chang

(57) ABSTRACT

A socket connector is provided for accommodating different sizes of chips and a printed circuit board and includes an insulative housing and a plurality of contacts embedded in the housing. The housing includes a conductive region and a margin region around the conductive region, and defines a supporting surface and a mounting surface opposite to the supporting surface. A number of passageways for accommodated the contacts extending through the isulative housing. Sidewalls extend upwardly from the margin region with a plurality of location blocks extending to the conductive region. The location blocks and the sidewalls are unitarily formed. A number of engaging grooves are defined in the margin region for assembling a number of aligning keys can be assembled to the respond engaging grooves for accommodating different sizes of chips.

16 Claims, 5 Drawing Sheets

SOCKET HAVING ALIGNING KEYS FOR ACCOMMODATING DIFFERENT SIZES OF INTEGRATED CHIPS

BACKGROUND OF THE INVENTION

1. Field of the Invention

The present invention relates to a socket, and more particularly to a socket with detachable aligning keys which can be configured according to different application of IC Chips.

2. Description of the Prior Art

Socket connectors are widely used for electrically connecting a chip and a PCB. The chip must be seated in the socket connector in a certain orientation, otherwise the chip will not normally work and the socket connector may be destroyed by the chip. In order to ensure the chip is correctly placed in the socket connector, a package of the chip has cutouts, and a housing of the socket connector for receiving the chip, correspondingly integrally forms a plurality of location keys to engage with the cutouts on the package. Examples for these kinds electrical connectors are disclosed in U.S. Pat. Nos. 7,083,456, 6,908,316 and 6,164,980. However, the location keys are near to the passageways for receiving the contacts, which may influence insertions of corresponding contacts.

FIG. 1 shows a traditional socket connector, comprises an insulative housing 10' receiving a plurality of terminals (not shown). The housing 10' defines a conductive region 101' with a plurality of passageways (not shown) extending therethrough and a plurality of terminals embedded in the responding passageways, and a margin region 102' around the conductive region 101' and has an upper face 103' and a bottom face 104'. Sidewalls 105' with a plurality of locating blocks 106' extending toward the conductive region 101' formed around the conductive region 101' extending upwardly from the margin region 102'. An integrated chip (not shown) is assembled to the housing 10' and positioned by the locating blocks 106'.

U.S. Pat. No. 7,207,808 issued to Ma on Apr. 24, 2007 discloses an improved socket connector. The socket connector of Ma '808 comprises an insulative housing 10 defining a plurality of passageways 12 and two recessed areas 110 corresponding to two cutouts on the package, a plurality of contacts and two detachable keys 16. After the contacts insert into the corresponding passageways 12, the detachable keys 16 are assembled to the insulative housing 10 by inserting into the recessed areas 110, and will not influence the assembly of the contacts. As such, during the inserting process of the contacts, the whole process will not be affected.

However, the sockets mentioned above can only match to one given type of package, so different types chips need corresponding types sockets. It increases the manufacturing cost of applying corresponding sockets. A socket for accommodating different size of chips is desirable Accordingly, a socket connector that solves the above problems is desirable.

SUMMARY OF THE INVENTION

In accordance with the present invention, aligning keys is formed individually from the housing and which can be assembled to the housing after the contacts are assembled to the passageways.

In order to achieve the object set forth, a socket connector is provided, for accommodating different sizes of integrated chips and a printed circuit board. The socket connector includes an insulative housing and a plurality of contacts embedded in the housing. The insulative housing includes a conductive region and a margin region around the conductive region and defines a supporting surface and a mounting surface opposite to the supporting surface. A plurality of passageways extend through the supporting surface to the mounting surface in the conductive region for receiving the contacts. Sidewalls extend upwardly in the margin region with a plurality of location blocks extending to the conductive region. The location blocks and the sidewalls are unitarily formed. A plurality of engaging grooves deposed through the margin region. The socket connector also includes a plurality of aligning keys assembled to the engaging grooves for accommodating different sizes of chips.

Other objects, advantages and novel features of the present invention will become more apparent from the following detailed description when taken in conjunction with the accompanying drawings, in which:

DESCRIPTION OF PREFERRED EMBODIMENTS OF THE INVENTION

Figure 1:
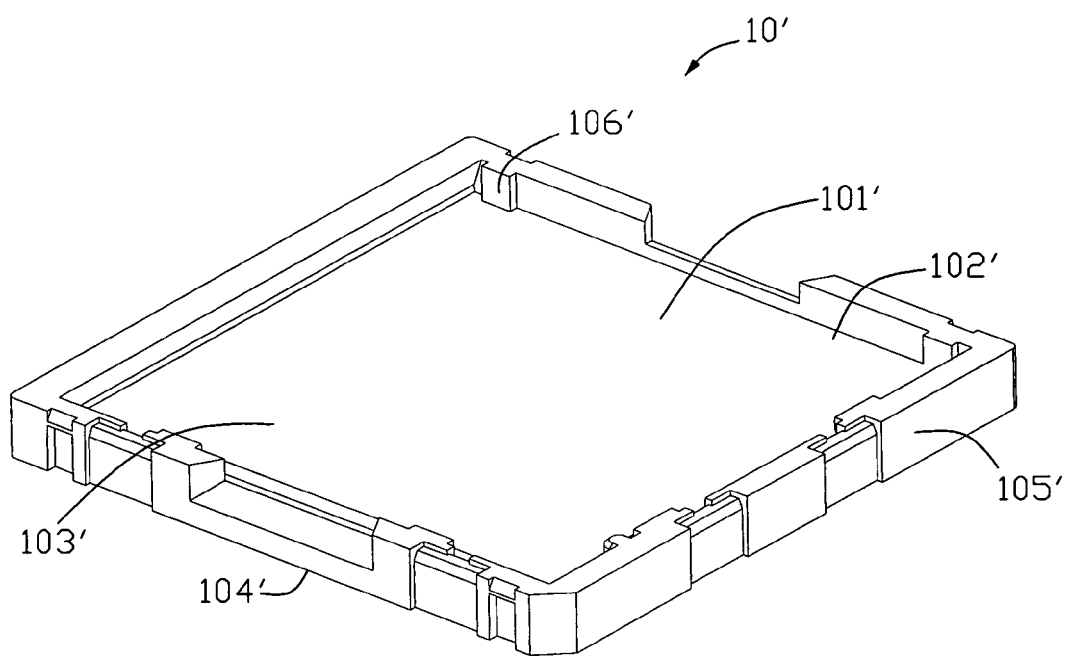
FIG. 1 is a perspective view of a traditional socket for mounting an integrated circuit chip on a printed circuit board.

Reference is now made to the drawings to describe the invention in detail.

As illustrated in FIGS. 2-5, a preferred embodiment of this invention provides a socket connector 1, for establishing electrical connection between an integrated chip (not shown) and a PCB (printed circuit board, not shown), includes an insulative housing 10 and a plurality of conductive contacts (not shown) embedded in the insulative housing 10.

The insulative housing 10 is substantially a rectangle and formed by dielectrical material, includes a conductive region 101 and margin region 102 around the conductive region 101. The insulative housing has a supporting surface 103 adapted to face the chip and a mounting surface 104 opposite to the supporting surface 103 adapted to face the PCB. A plurality of passageways (not shown) extend through the supporting surface 103 to the mounting surface 104 in the conductive region 101 for receiving the contacts. Sidewalls 105 extend upwardly from the margin region 102 with a plurality of location blocks 106 integrally formed thereon and extending toward the conductive region 101. The supporting surface 103 and the sidewalls 105 together define a receiving space (not labeled) in a center of the insulative housing 10 for accommodating the chip. A plurality of engaging grooves are located on the margin region 101 and extending therethrough. The engaging grooves includes a plurality of first grooves 107 located between the sidewalls 105 and the conductive region 101, and a plurality of second grooves 109 in the sidewalls 105 whereby the first grooves 107 are closer to the conductive region 101 than the second grooves 109. In this embodiment, the engaging grooves are arranged in a pair of opposite sidewalls 105 for ensuring the orientation of the chip.

The socket connector 1 also includes a plurality of aligning keys 108 assembled to the engaging grooves 107. Each of the first and second grooves 107, 109 is adapted for receiving an aligning key 108, and the aligning keys 108 in the first grooves 107 are closer to the conductive region 101 than the aligning keys 108 in the second grooves 109. Furthermore, the aligning keys 108 assembled to the second grooves 109 are closer to the conductive region 101 than the location blocks 106.

Figure 5:
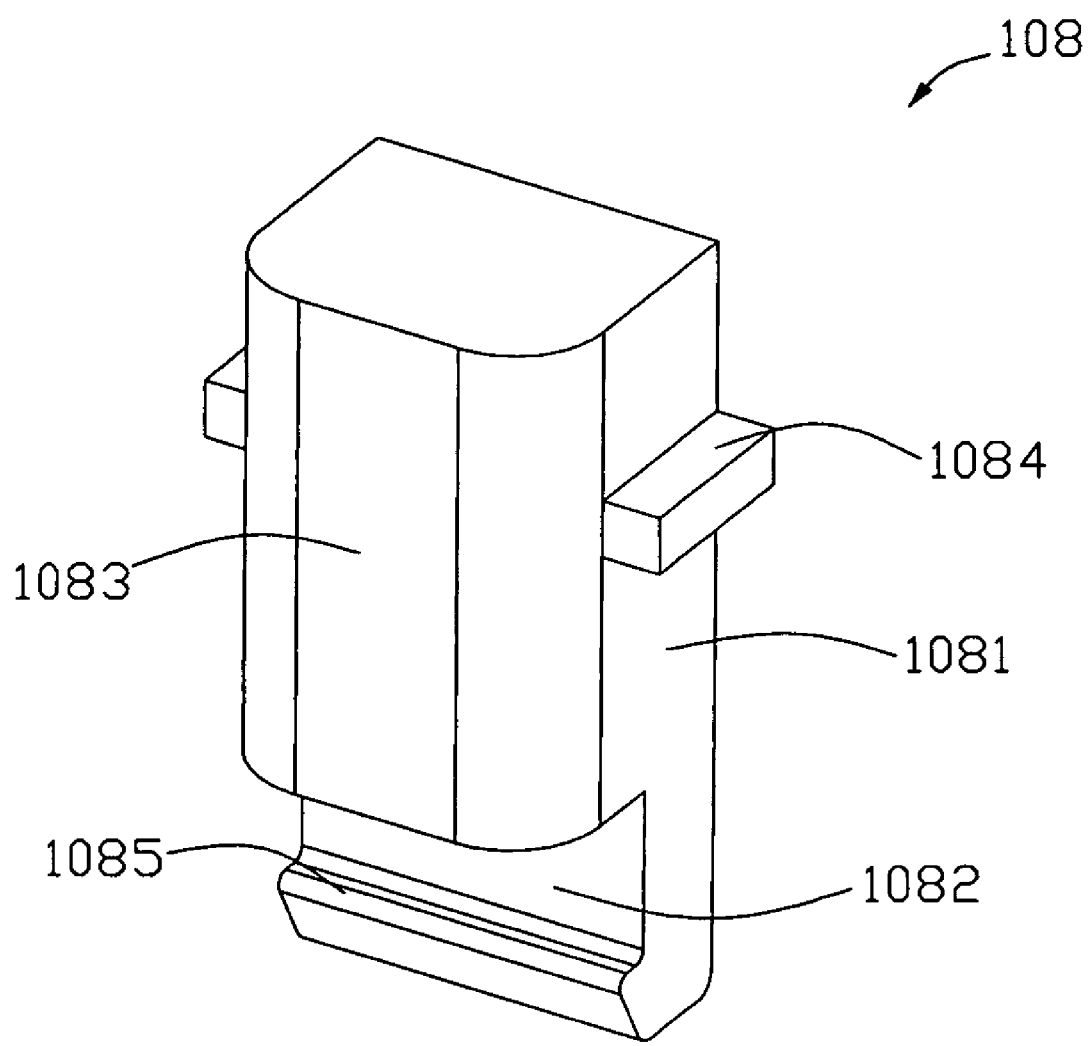
FIG. 5 is a perspective view of one of the aligning key shown in FIG. 3.

Referring to FIG. 5, the aligning keys 108 each includes a base portion 1081, a clipping portion 1082 with a concave (not labeled) beneath the base portion 1081, and a pair of arm portions 1084 at opposite sides of the base portion 1081. The base portion 1081 has an abutting surface 1083 facing to conductive region 101 and the arm portions 1084 are above the sidewalls 105 when the aligning key 108 is assembled to the engaging groove. The capping portion 1082 has a hook 1085 for engaging with a bottom end of the insulative housing 10.

Figure 2:
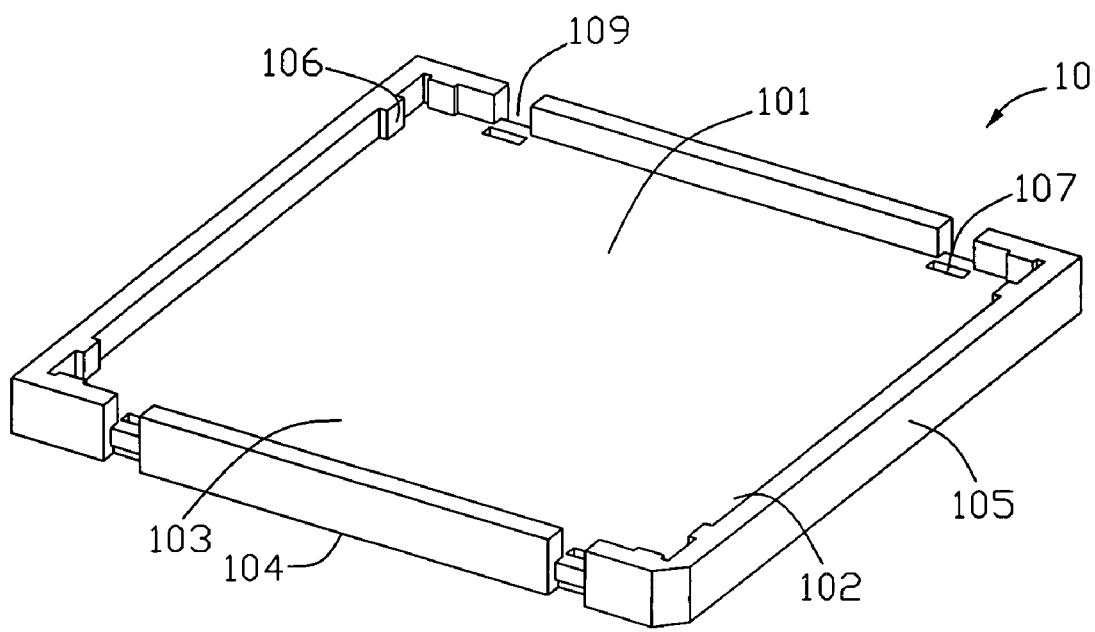
FIG. 2 is a perspective view of the insulative housing of the present invention.
Figure 3:
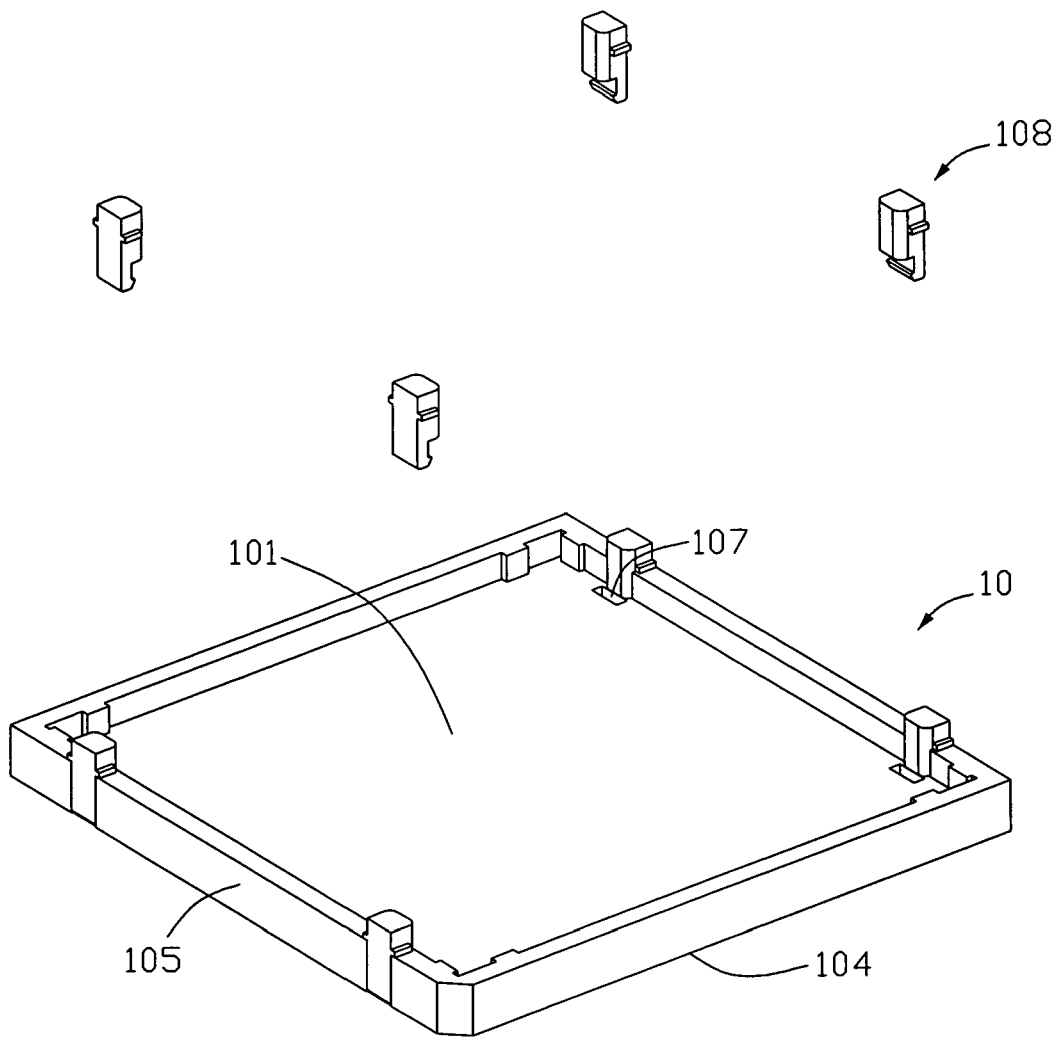
FIG. 3 is another perspective view of the insulative housing shown in FIG. 2, with part of the aligning keys assembled to the insulative housing.
Figure 4:
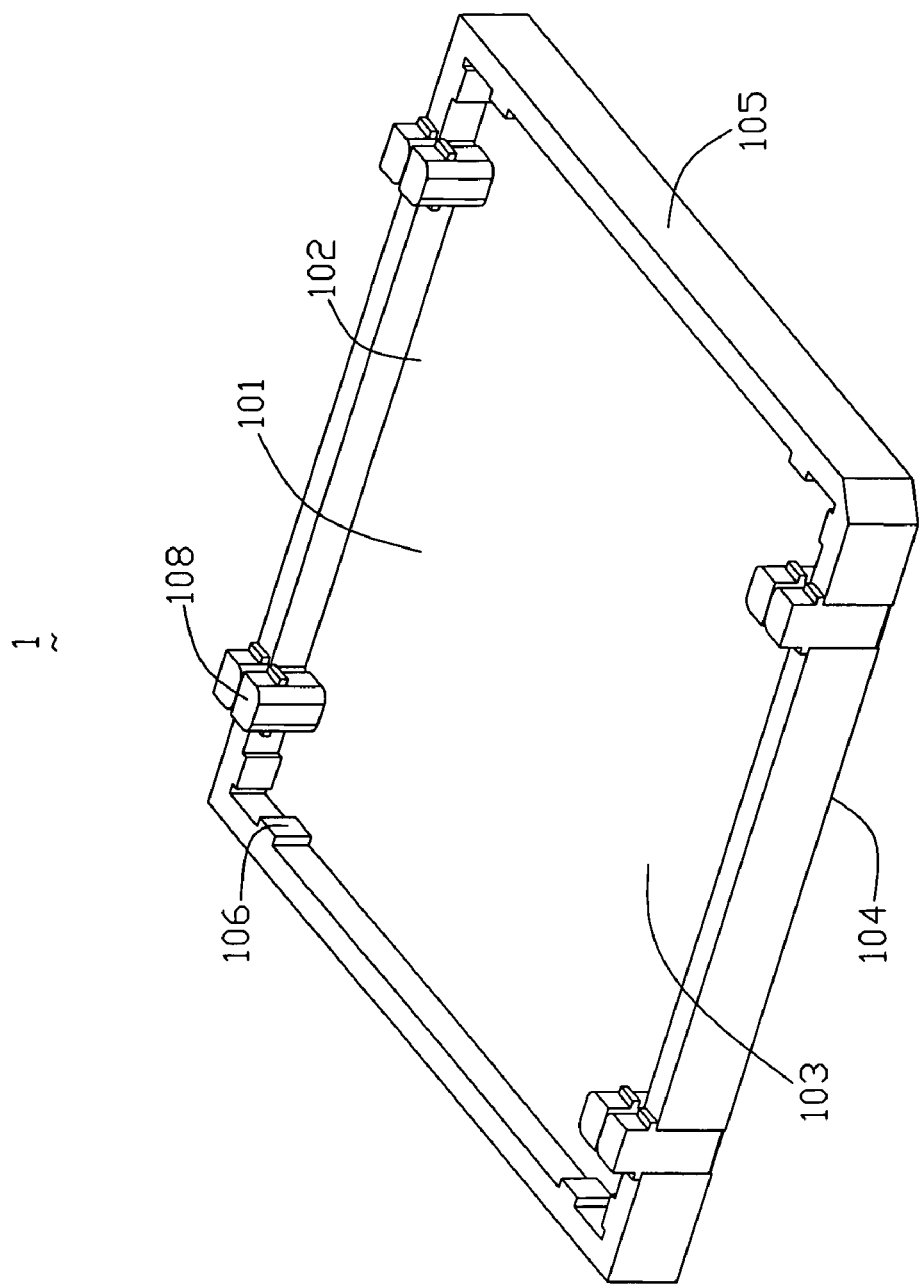
FIG. 4 is a perspective view of the insulative housing in FIG. 3; with all the aligning keys assembled to the housing.

When using the socket connector 1 of the present invention, the aligning keys 108 can assembled to the different engaging grooves according to different sizes of the integrated chips. In a preferred embodiment of this invention, the socket connector 1 can accommodate three different sizes of types of integrated chips. As shown in FIG. 2, when the socket connector 1 is used for accommodating a large size chip (not shown), the location blocks 106 can position the chip without assembling the aligning keys 108 for the aligning keys assembled to the engaging grooves are closer to the conductive region 101 than the location blocks 106. As FIG. 3 illustrated, the aligning keys 108 is only assembled to the second grooves 109 thereby positioning a smaller size chip (not shown). As FIG. 4 illustrated, the aligning keys 108 are assembled to the first grooves 107 by which a smallest size chip (not shown) can be orientated for the aligning keys 108 in the first grooves 107 are closest to the conductive region 101 than the aligning keys 108 in the second grooves 109 and the location blocks 106. When assembling the aligning keys 108, press down the clipping portion 1082 into the engaging grooves 107, 109, then the clipping portions 1082 with concave clip in the engaging grooves 107, 109, and the abutting face 1083 face to the conductive region 101 for abutting against the chip.

Furthermore, although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. A socket connector, comprising:
   an insulative housing and a plurality of contacts embedded in the insulative housing;
   the insulative housing comprising:
   a conductive region and a margin region;
   a supporting surface adapted to face a chip and a mounting surface opposite to the supporting face;
   a plurality of passageways extending from the supporting surface to the mounting surface in the conductive region for receiving the contacts;
   sidewalls formed around the conductive region and extending upwardly in the margin region;
   a plurality of engaging grooves extending therethrough on the margin region, the engaging grooves comprising first grooves and second grooves on the margin region, and the first grooves being closer to the conductive region than the second grooves; and
   a plurality of aligning keys assembled to the engaging grooves for accommodating different sizes of chips.

2. The socket connector of claim 1, wherein the engaging grooves are disposed in a pair of opposite sidewalls of the insulative housing.

3. The socket connector of claim 1, wherein each aligning key includes a base portion and a clipping portion with a concave beneath the base portion.

4. The socket connector of claim 3, wherein said base portion defines an abutting surface facing to the conductive region, and a pair of arm portions at opposite sides thereof and above the sidewalls when the aligning key is assembled to the engaging grooves.

5. The socket connector of claim 3, wherein the clipping portion is locked with the insulative housing.

6. The socket connector of claim 1, wherein each of the first and second grooves is adapted for receiving an aligning key and the aligning keys in the first grooves are closer to the conductive region than the aligning keys in the second grooves.

7. The socket connector of claim 6, wherein the second grooves are located in the sidewalls and the first grooves are located between the sidewalls and the conductive region.

8. The socket connector of claim 1, wherein the sidewalls include a plurality of location blocks unitarily formed thereon and extending toward the conductive region.

9. The socket connector of claim 8, wherein the aligning keys assembled to the engaging grooves are closer to the conductive region than the location blocks.

10. A socket connector for electrically connecting a chip and a PCB (Print Circuit Board), comprising:
    an insulative housing comprising a conductive region and a margin region and provided with a supporting surface adapted to face the chip, and a mounting surface adapted to face the PCB;
    a plurality of passageways extending from the supporting surface to mounting surface in the conductive region for receiving the contacts;
    sidewalls formed around the conductive region and extending upward from the margin region, the sidewalls integrally forming a plurality of location blocks extending toward the conductive region;
    a plurality of engaging grooves extending through the margin region, the engaging grooves comprising first grooves and second grooves, and the first grooves being closer to the conductive region than the second grooves; and
    a plurality of aligning keys assembled to the engaging grooves, the location blocks and the aligning keys being adapted to accommodate different sizes of chips.

11. The socket connector of claim 10, wherein each of the first and second grooves is adapted for receiving an aligning key and the aligning keys in the first grooves are closer to the conductive region than the aligning keys in the second grooves.

12. The socket connector of claim 11, wherein the aligning keys assembled to the second grooves are closer to the conductive region than the location blocks.

13. A socket connector comprising:
    an insulative housing defining a plurality of peripheral side walls extending upward from a base, said side walls cooperating with said base to commonly define a receiving cavity;
    a plurality of outer grooves formed in the side walls;
    a plurality of inner grooves formed in the base, and aligned with and in front of the corresponding outer grooves, respectively;

a plurality of aligning keys selectively assembled to the corresponding outer grooves or the corresponding inner grooves, respectively, for retaining selectively a larger electronic package or a smaller electronic package.

14. The socket connector of claim 13, wherein each of said aligning keys is individually assembled to the corresponding outer groove at a specific location of the housing with another of said aligning keys assembled to the corresponding outer groove at another specific location for accommodating a larger sized electronic package.

15. The socket connector of claim 13, wherein every two of said aligning keys are stacked to each other and commonly assembled to a common position of the housing for accommodating a smaller sized electronic package.

16. The socket connector of claim 15, wherein said two stacked aligning keys are respectively located in the corresponding inner groove and the corresponding outer groove at said common place.

* * * * *